United States Patent [19]
Neron

[11] Patent Number: 5,602,512
[45] Date of Patent: Feb. 11, 1997

[54] COMPARATOR OF PHASE BETWEEN A DIGITAL SIGNAL AND A CLOCK SIGNAL, AND CORRESPONDING PHASE LOCKED LOOP

[75] Inventor: Christophe Neron, Nantes, France

[73] Assignee: Matra MHS, Nantes, France

[21] Appl. No.: 568,341

[22] Filed: Dec. 6, 1995

[30]   Foreign Application Priority Data

Dec. 8, 1994 [FR] France ................................. 94 14780

[51] Int. Cl.$^6$ ............................. H03D 13/00; H03L 7/085
[52] U.S. Cl. ............................. 331/1 A; 331/27; 331/57; 327/12
[58] Field of Search ............................. 331/1 A, 27, 57; 327/12, 43

[56]              References Cited

U.S. PATENT DOCUMENTS

| | | | |
|---|---|---|---|
| 4,535,459 | 8/1985 | Hogge, Jr. ................................. | 331/1 A |
| 5,053,649 | 10/1991 | Johnson ................................. | 331/1 A |
| 5,115,208 | 5/1992 | Masdea et al. ................................. | 327/12 |

FOREIGN PATENT DOCUMENTS 2091961   8/1982   United Kingdom .

OTHER PUBLICATIONS

Journal of Lightwave Technology, vol. 3, No. 6, Dec. 1985, New York, USA pp. 1312–1314, Charles R. Hogge, Jr. "A Self Correction Clock Recovery Circuit".

*Primary Examiner*—Siegfried H. Grimm
*Attorney, Agent, or Firm*—Larson & Taylor

[57]              ABSTRACT

A comparator of phase between a digital signal and a clock signal adapted for the construction of a phase locked loop in integrated circuit form, that includes a first channel formed by a flip-flop and an exclusive OR gate, and a second channel formed by a second exclusive OR gate and a delay circuit whose delay is set to half the period of the clock signal. The first channel receives the digital signal and the clock signal and delivers a first detection signal of transition of the digital signal. The second channel receives only the digital signal and delivers a second detection signal of transition of the digital signal.

6 Claims, 5 Drawing Sheets

HOGGE COMPARATOR, WHEN BALANCED

CLOCK IN PHASE WITH THE DATA $\Delta\varphi = T_0/2$

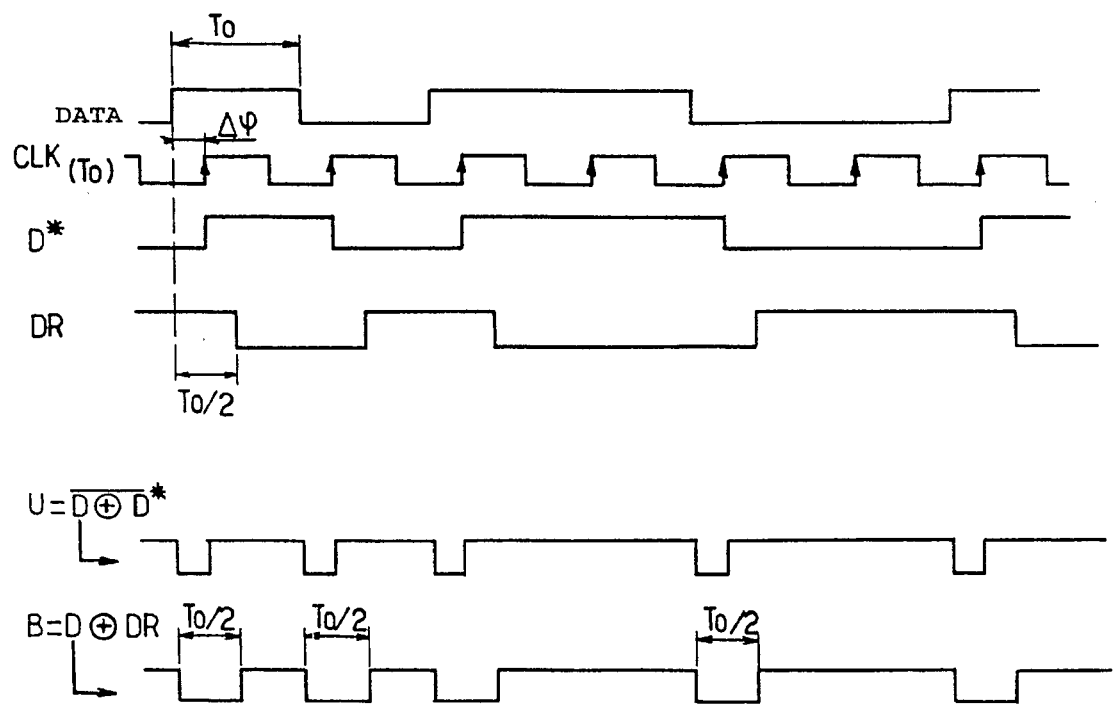
FIG. 4a. CLOCK PHASE LEADS THAT OF THE DATA
$\Delta \varphi < T_0/2$
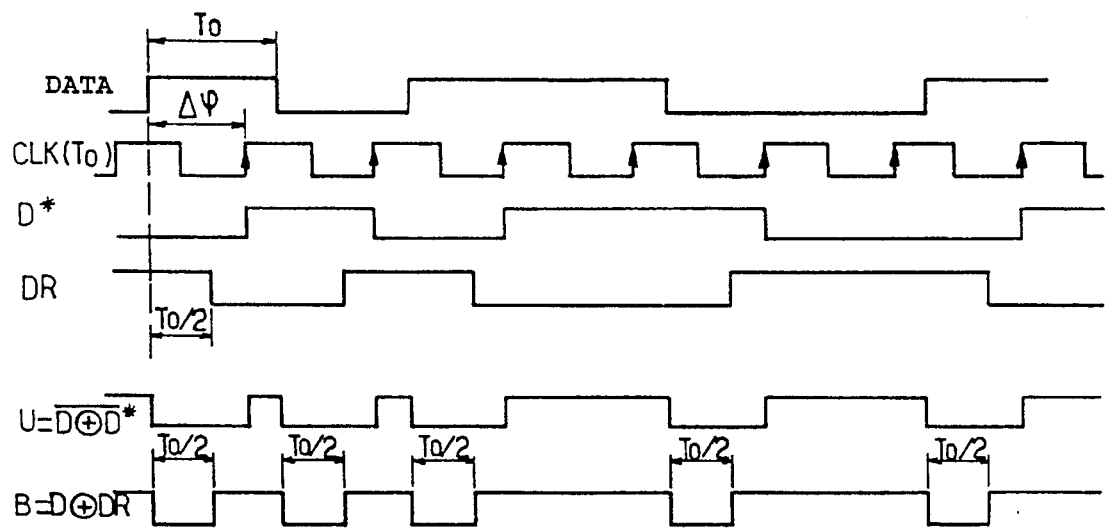
FIG. 4b. CLOCK PHASE LAGS THAT OF THE DATA
$\Delta \varphi > T_0/2$

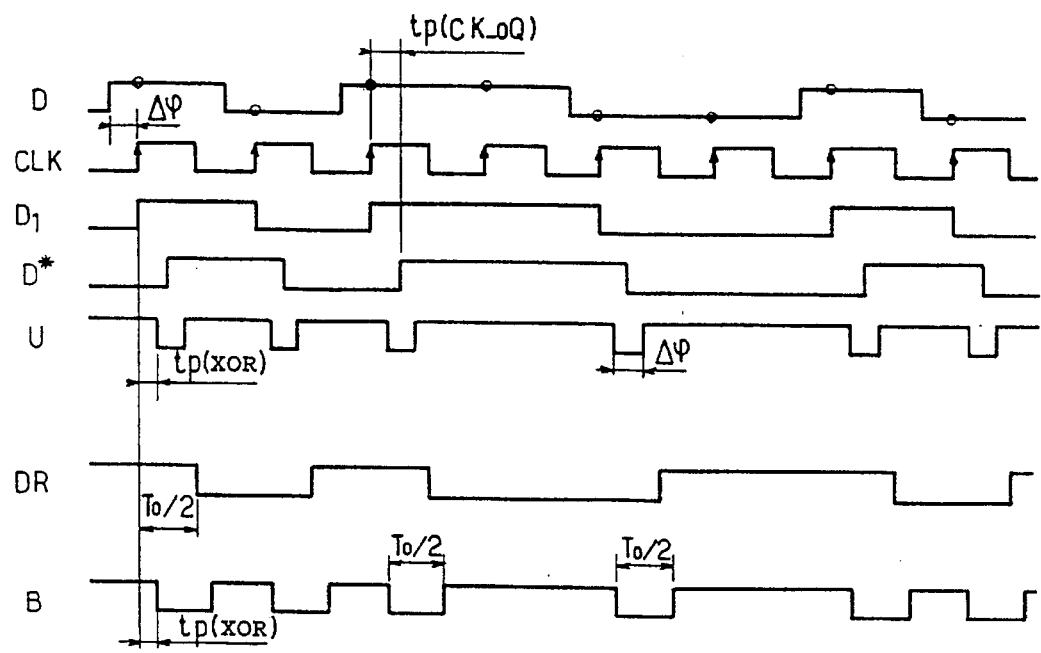
FIG. 6a. CLOCK LEADING
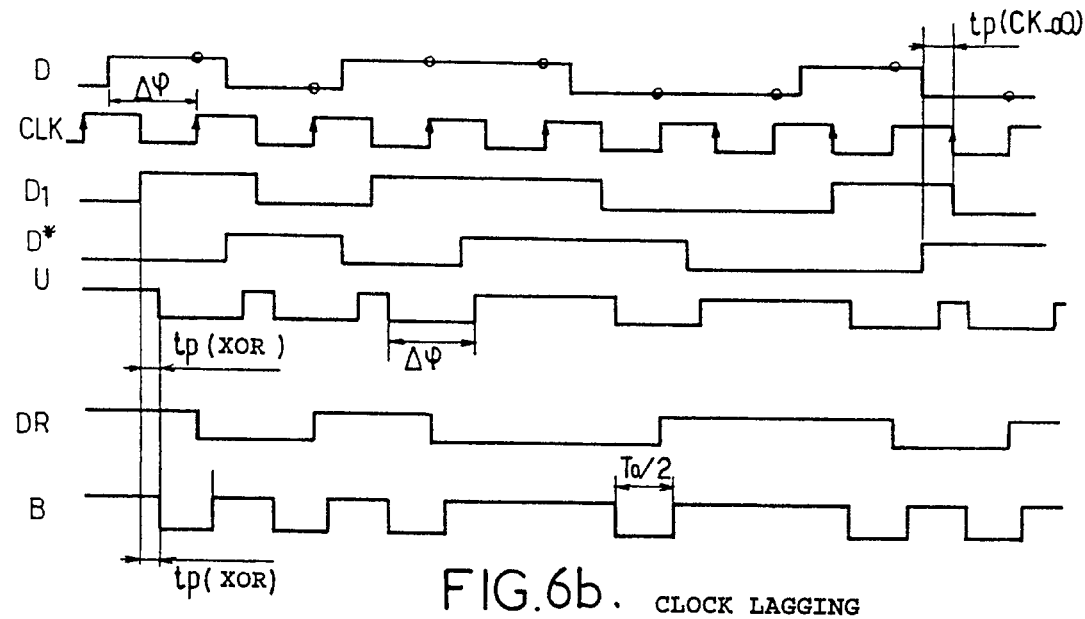
FIG. 6b. CLOCK LAGGING

COMPARATOR OF PHASE BETWEEN A DIGITAL SIGNAL AND A CLOCK SIGNAL, AND CORRESPONDING PHASE LOCKED LOOP

The invention relates to a device for comparing the phase of a digital input data signal with that of a clock signal, and the implementation of the latter within the technology of integrated circuits, in order to provide, on the basis of a digital data signal, the local regeneration of a reference clock signal.

In order to regenerate a reference clock signal, in phase with a digital data signal, it is currently possible to use a Hogge phase comparator within a phase locked loop, the latter allowing local regeneration of a clock signal which is perfectly synchronized with the incoming stream of processed data.

A phase comparator of this type has been described in the article published by Charles R. Hogge, entitled "A Self Correcting Clock Recovery Circuit", Journal of Lightwave Technology, Vol. LT3, No. 6, December 1985. This type of comparator proves satisfactory and simultaneously fulfils the digital data regeneration and resynchronization functions, as well as self-correcting the holding at mid-bit of the active edge of the local reference clock. Furthermore, it exhibits a wide static phase excursion characterized by $[-\eta, +\eta]$ linearity and independence of operation with respect to the frequency of the reference clock signal.

However, analysis of the signals from the ports 6 and 7, at the input of the output comparator, such as represented in FIG. 1, relative to a comparator of the prior art of this type, shows that, at phase balance, they are 180° offset. Consequently, the signal to be integrated, delivered by the aforesaid output comparator, possesses a large peak-to-peak ripple when phase balance is achieved.

The aforesaid signal to be integrated, or differential signal, thus possesses a high peak-to-peak amplitude and a maximum frequency equal to the binary element frequency, or bit frequency, of the data signal. Such a signal is liable to constitute a further source of phase "jitter" in the device and requires the implementation of highly tailored filtering. This jitter phenomenon may therefore turn out to be very troublesome, especially when cascading successive digital signal regeneration devices in which the known phenomenon of systematic build-up of phase jitter may impair the operation of a digital link.

The subject of the present invention is the implementation of a phase comparator which, while exhibiting the advantages of the above type of comparator, allows a considerable reduction in the aforesaid additional phenomenon of phase jitter.

The device for comparing the phase of a digital input data signal with that of a clock signal delivered by a reference oscillator, which is the subject of the present invention, is noteworthy in that it comprises a first channel formed, on the one hand, by a bistable flip-flop receiving the digital data signal on one input and the clock signal on a clock input and delivering a comparison signal, and, on the other hand, by a first exclusive OR logic gate receiving the digital data signal on a first input and the comparison signal on a second input, the first channel delivering a first detection signal of transition of the digital signal. It also comprises a second channel formed, on the one hand, by a second exclusive OR logic gate receiving the digital data signal on a first input, and, on the other hand, by an adjustable delay circuit whose set delay value is equal to half the period of the clock signal. The delay circuit receives the digital data signal and delivers a delayed digital data signal to a second input of the second exclusive OR gate, the second channel delivering a second detection signal of transition of the digital input data signal.

The phase comparator device, which is the subject of the present invention, finds application in the construction of integrated circuits, especially in CMOS or BiCMOS technology. It will be better understood on reading the description and looking at the drawings below, in which, apart from FIG. 1 which relates to the prior art, FIGS. 2a and 2b represent a schematic diagram of the phase comparator, which is the subject of the present invention, and a timing diagram of the signals of this comparator when phase balance between the digital data signal and the clock signal is achieved;

FIG. 3b represents a detail from the embodiment of FIG. 3a;

FIGS. 4a and 4b represent a timing diagram of the noteworthy signals of the phase comparator, which is the subject of the present invention, in the embodiment thereof illustrated in FIG. 3c, in the case where the phase of the clock signal leads and then lags respectively relative to the data signal;

FIGS. 6a and 6b represent timing diagram of the noteworthy signals of the phase comparator in the embodiment thereof represented in FIG. 5, in the case where the phase of the clock signal leads and then lags respectively relative to the digital data signal.

Figure 1:
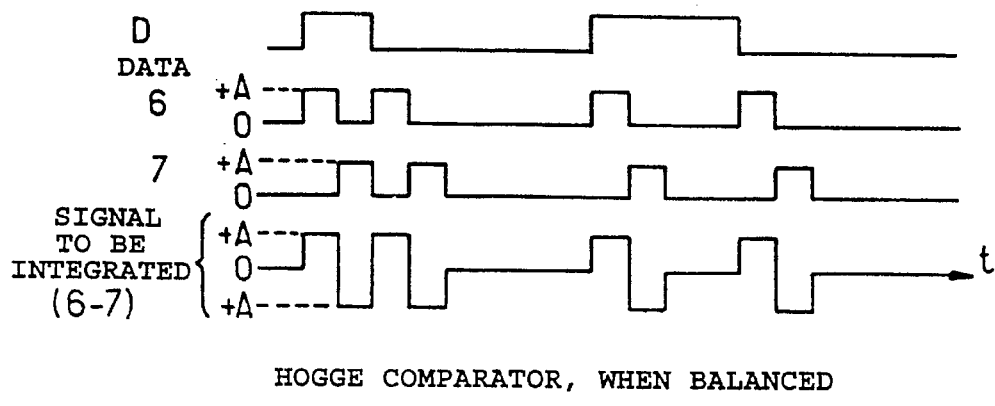
Figure 2A:
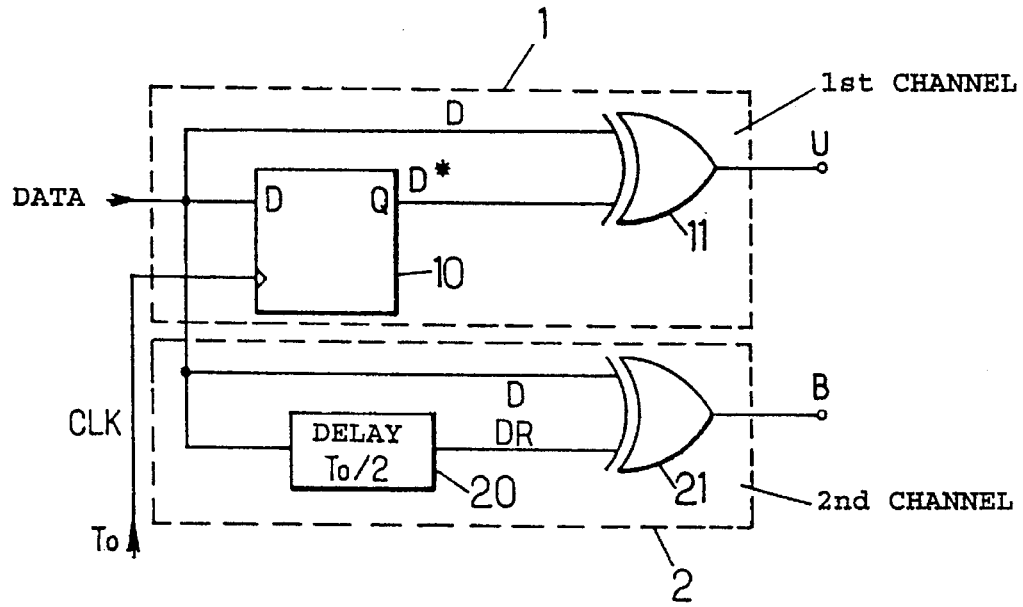

A more detailed description of the device for comparing the phase of a digital input data signal, referenced by the letter D, with that of a clock signal, referenced by the letters CLK, delivered by a reference oscillator, which is the subject of the present invention, will now be given in conjunction with FIG. 2a.

As represented in the aforesaid figure, it is indicated that the phase comparator device according to the invention comprises a first channel, denoted 1, formed by a bistable flip-flop bearing the reference 10, and by a first exclusive OR logic gate bearing the reference 11. The bistable flip-flop 10 receives the digital data signal D on one input and the clock signal CLK on a clock input, and delivers a corresponding comparison signal, denoted D*.

The first exclusive OR logic gate 11 receives the digital data signal D on a first input and the comparison signal D* on a second input. It delivers, as output from the first channel, a signal, denoted U, constituting a detection signal of transition of the digital signal satisfying the relation:

$U = D \oplus D^*$, where $\oplus$ represents the exclusive OR operator.

The phase comparator device, which is the subject of the present invention, also includes a second channel, denoted 2, formed by a second exclusive OR logic gate, bearing the reference 21, receiving the digital data signal D on a first input and a delay circuit, bearing the reference 20, whose delay value is set and equal to half the period of the clock signal CLK. The delay circuit 20 receives the digital data signal D and delivers a delayed data signal, denoted DR, to the second input of the second exclusive OR gate 21. The second exclusive OR gate 21 delivers at its output, and as output from the second channel, another detection signal of transition of the digital input signal, denoted B. The detection signal U produces a pulse with each transition of the digital data signal D whose duration represents the delay of the rising edge of the clock signal CLK with respect to each transition of the digital data signal D. The detection signal U is therefore representative of the phase shift $\Delta\phi$ between the clock signal CLK and the digital data signal D.

The detection signal B produces a pulse with each transition of the digital signal D whose duration is constant and equal to the delay value of the delay circuit 20. When the value of the delay of the delay circuit 20 is set to the value of half the period $T_0/2$ of the clock signal CLK and when phase balance is achieved, the detection signals U and B are in phase and ideally identical. As compared with the detection signals of the Hogge comparator, the aforesaid detection signals U and B then have the advantage, owing to their being in phase when balanced, of reducing the phenomenon of peak-to-peak ripple of the control error signal of the controlled oscillator.

Figure 2B:
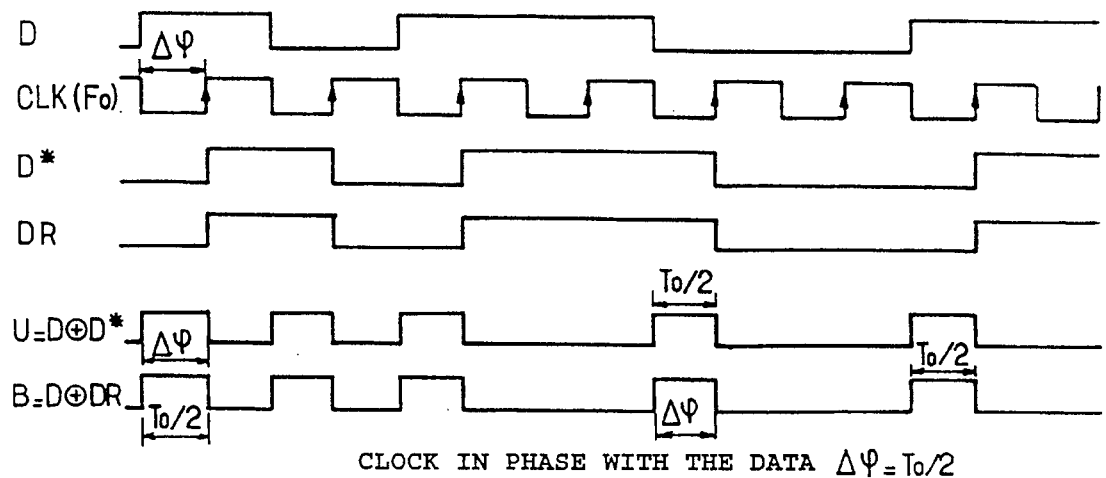

A time diagram of the various signals is represented in FIG. 2b when this phase balance is established.

In FIG. 2b, it may be observed that, when the value of the delay of the delay circuit 20 is equal to half the period of the clock signal CLK and when phase balance is achieved, the rising edges of the clock CLK are situated ideally in the middle of a bit of the digital data signal D on the one hand, and that the rising edges of the complemented clock signal $\overline{CLK}$ are situated ideally in the middle of a bit of the digital data signals D* and DR on the other hand. It is therefore indicated that the digital data signals D, D* or DR may be used as digital data signals which are resynchronized relative to the clock signal CLK or $\overline{CLK}$.

In general, it is indicated on the one hand, that the clock signal CLK is a signal with stabilized frequency which exhibits a duty ratio which is ideally equal to ½. It is delivered by a reference oscillator, this being an oscillator with stable central frequency.

As a non-limiting example, it is indicated that the reference oscillator exhibiting a stable central frequency may be constructed from a VCX0 type controlled quartz oscillator.

Generally, it is indicated on the other hand, that the value of the delay of the delay circuit 20 is equal to half the period of the clock signal CLK, and that this delay circuit 20 can be embodied outside or inside the silicon chip.

As a non-limiting example, it is indicated that the delay circuit 20 may be programmable and outside the silicon, in which case it is accurate but not monolithically integrable, or may be monolithically integrated in the form of a resultant analogue delay or of a logic gate propagation time, in which case it is inaccurate and highly sensitive to variations in temperature and in technological process.

In order to remedy the aforesaid difficulties, in accordance with a particularly advantageous aspect of the phase comparator device, which is the subject of the present invention, it is indicated that the latter can, in a particularly useful manner, be integrated into a phase locked loop, which will be described in conjunction with FIGS. 3a and 3b for example.

For this purpose, it is indicated that the reference oscillator 4 delivering the clock signal CLK can be a controlled oscillator, of VCO type, which delivers the clock signal CLK at the frequency $F_0$ (period $T_0$).

Figure 3B:
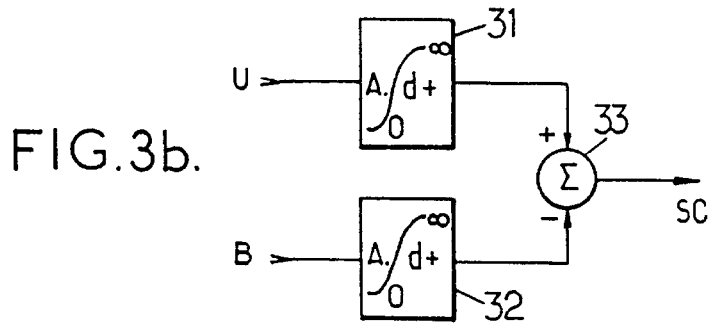
Figure 3A:
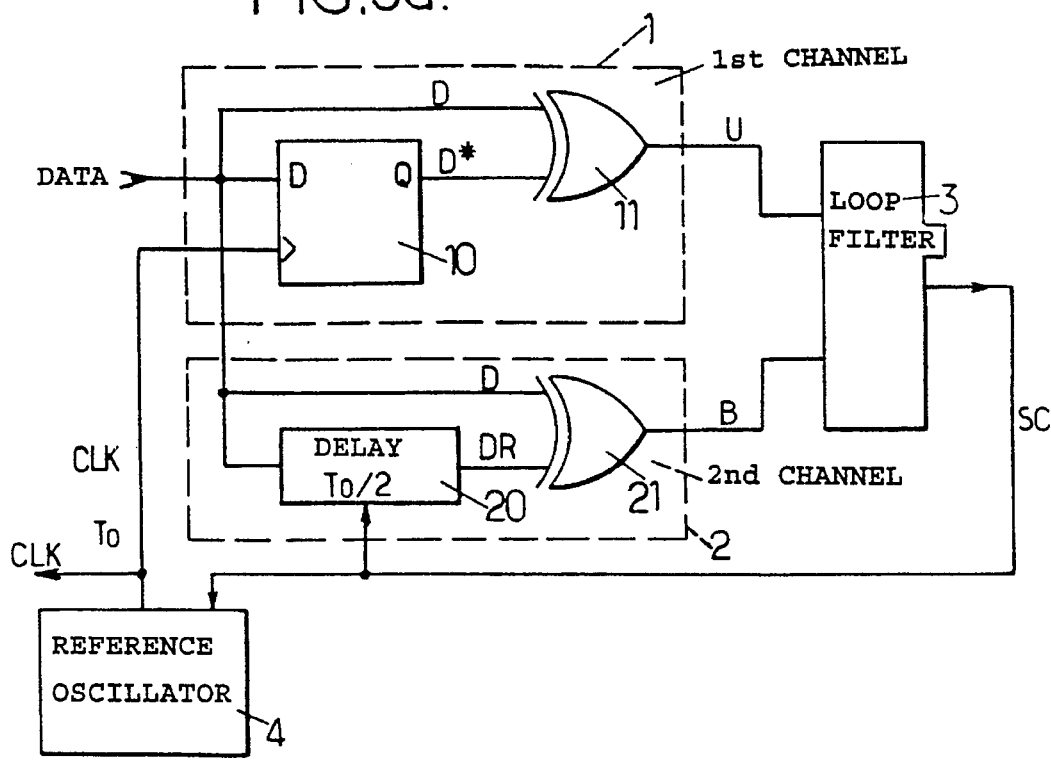
FIG. 3a represents a variant embodiment of the phase comparator, which is the subject of the present invention, when it is used in a phase locked loop with a controlled oscillator.

In this case, as represented in FIG. 3a, the phase comparator device according to the invention furthermore comprises a loop filtering circuit 3 receiving the signals U and B delivered by the first and by the second channel, this filtering circuit 3, constituting a loop filter, whose operating diagram is represented in FIG. 3b, delivering a control signal, denoted SC, this control signal delivered to the input of the controlled oscillator 4 making it possible to form a phase locked loop. In practice, it is indicated that the controlled oscillator 4 can be controlled either by voltage, or by current.

It is thus understood that, by virtue of the control signal SC, the frequency and phase of the clock signal CLK can be regulated and slaved to a setpoint value. To provide phase slaving, that is to say the coincidence of the rising edge of the clock signal CLK with the central position of a bit of the data signal, as represented in FIG. 2b, the control signal SC is also delivered to a control input of the delay circuit 20, so as to provide corresponding control of the delay value afforded by this delay circuit with a constant value $T_0/2$.

Figure 5:
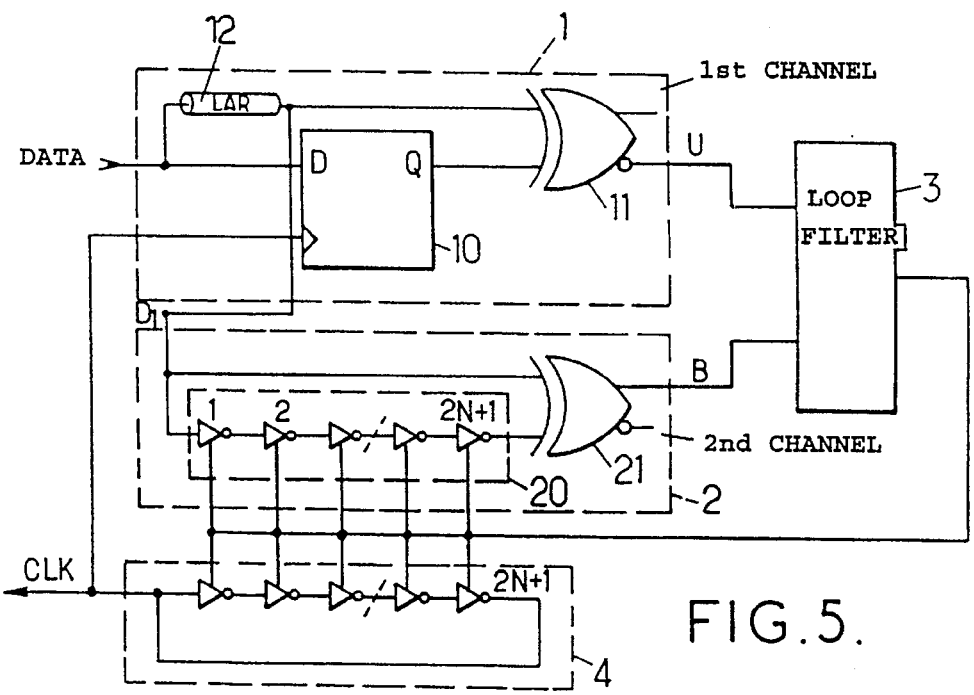
FIG. 5 represents an advantageous embodiment detail of the phase comparator, which is the subject of the present invention, such as represented in FIG. 3c, for very high frequency applications.
Figure 3C:
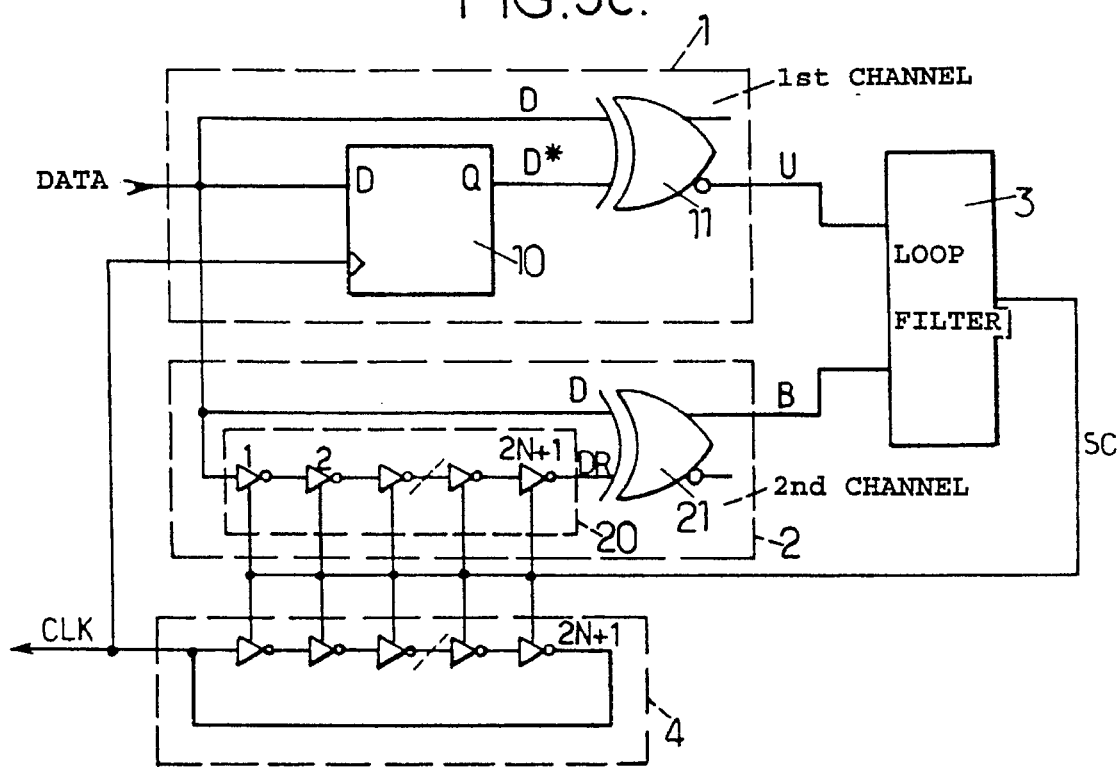
FIG. 3c represents a preferred embodiment of the phase comparator, which is the subject of the present invention, in which the controlled oscillator consists of a ring oscillator.

In the aforesaid embodiment, relating to FIG. 3a, and for the purpose of providing phase slaving or latching of the reference oscillator to the correct extraction frequency, it is indicated that the controlled oscillator must, in the phase locked loop latching procedure, initially be preset to a frequency value which is equal to or very close to the final frequency $F_0$ to be extracted. It is also indicated by way of example that this initial presetting of the central frequency can be provided, either by the use of a VCXO type quartz reference oscillator, or by an automatic device for initial presetting of the central frequency, or by manual tuning. It is finally indicated that these various devices for assisting with the acquisition of the timing of the phase locked loops presented in FIGS. 3a, 3c, 5, are not described, being as they are known from the state of the art.

Following the presetting of the frequency of the reference oscillator to a value close to the value $F_0$, it is indicated that, in relation to FIG. 3a, the control signal SC obtained after filtering the signals U and B output by the phase comparator, has variations which are substantially proportional to the phase error $\Delta\phi$ between the digital data signal D and the clock signal CLK. When phase balance is achieved, the data signal D and the clock signal CLK exhibit a static phase shift $\Delta\phi=T_0/2$, as represented in the timing diagrams of FIG. 2b. It is also pointed out that when phase balance is achieved, the two signals U and B output by the phase comparator then have an identical mean value.

In order to embody the loop filter 3, it is indicated that the latter can include, in a non-limiting advantageous manner, as represented in FIG. 3b, an integrator circuit 31 receiving the signal U and delivering a corresponding integrated signal, and an integrator circuit 32 receiving the signal B and delivering a corresponding integrated signal. A subtracter circuit 33 receives the integrated signals delivered by the integrator circuit 31 and the integrator circuit 32 in order to deliver the control signal SC. All of the aforesaid circuits may for example be embodied in differential integrator active filter form or in load pump form.

A preferred embodiment of the phase comparator device, which is the subject of the present invention, will now be described in conjunction with FIG. 3c. In FIG. 3c, the same references designate the same elements as in FIG. 3a for example.

As represented in the aforesaid figure, it is indicated that the delay circuit 20 is an adjustable delay circuit, formed by a given number of inverter circuits, each inverter circuit being denoted from 1 to 2N+1. The inverter circuits are connected in cascade and in odd numbers and afford a corresponding elementary switching delay. Each inverter circuit 1 to 2N+1 is voltage-controlled by the control signal SC. With each inverter circuit affording a delay proportional to the control voltage SC, the overall delay afforded by the cascaded inverter circuits can thus be set with respect to a mean value.

Similarly, as represented in the aforesaid FIG. 3c, it is indicated that the reference oscillator 4 can, in a particularly advantageous manner, consist of a ring oscillator formed by an odd number of inverters, each of the inverters likewise being voltage-controlled by the control signal SC.

The inverters making up the ring oscillator are cascaded, the output of the last inverter being fed back to the input of the first. Of course, the number of inverters forming the delay circuit and the ring oscillator is identical, the inverters furthermore being paired. Just like the controlled oscillator 4, the inverters may be controlled either by voltage, or by current.

For a propagation time $Tp_i$ of an elementary basic inverter making up the delay device 20, respectively the ring oscillator 4, when the latter is voltage-controlled or current-controlled by the control signal SC, and for an overall delay value afforded by the 2N+1 inverters equal to $T_0/2$, the ring oscillator oscillates at the corresponding clock frequency $F_0$, the overall delay afforded being equal to half the period of the clock signal $T_0/2$. In this case, the frequency of the clock signal which is delivered by the ring oscillator 4 satisfies the relation:

$$F_0 = \frac{1}{2(2N+1)Tp_i}$$

in which relation $Tp_i$ denotes the propagation time or delay time afforded by each elementary inverter controlled by the value of the voltage of the control signal SC.

The device, which is the subject of the present invention, such as represented in FIG. 3c, is particularly advantageous insofar as it can be integrated directly into an integrated circuit so as to provide, on the basis of a digital data signal, the local regeneration of a reference clock signal, this signal being of course synchronized with the data signal D.

Finally, as represented in FIG. 5, it is pointed out that, for high-frequency applications in which the propagation times of the logic elements of the phase comparator can no longer be neglected compared with the period of the clock signal CLK, that it is advantageous to provide a compensation delay circuit 12 at the data input of the first exclusive OR circuit 11. This delay circuit 12 makes it possible to compensate for the delay introduced by the flip-flop circuit 10 by furnishing a delay of specified value, substantially equal to the delay introduced by the aforesaid flip-flop circuit 10, on the data path. The timing diagrams of the noteworthy signals of the phase comparator relating to FIG. 5 are indicated in FIGS. 6a and 6b, respectively when the phase of the clock signal CLK leads and lags with respect to the digital data signal. In the case of FIGS. 6a and 6b, the delay introduced by the compensation delay circuit 12 compensates for the propagation time of the flip-flop. This propagation time $tp(CK \rightarrow Q)$ is assumed equal to ¼ of the period of the clock signal. In these figures, tp(XOR) denotes the propagation time of the exclusive OR gates. It is also indicated that the delay circuit 12 can easily be embodied in the form either of propagation time of monolithically integrable logic gates allowing compensation of the variations in the propagation time of the flip-flop 10, or of RC type circuits whose monolithic integration is still tricky.

There has thus been described a device for comparing the phase of a digital signal with that of a clock signal which is particularly advantageous insofar as, while the performance of circuits of the prior art such as the circuits described by the article by Hogge mentioned previously in the description is preserved, that is to say:

automatic centering of an active edge of the clock at the middle of a bit, large static phase excursion of the comparator from −180° to +180°, similar simplicity, absence of introduction of an exterior delay, which cannot be embodied in integrated circuit form, independence of data throughput over the aforesaid range of controlled operation, the advantages relating to the suppression of 180° phase shifts between the signals U and B at phase balance are obtained, thereby making it possible to reduce the peak-to-peak ripple in the control error signal SC of the reference oscillator and hence to improve the phase jitter performance of the whole system.

I claim:

1. Device for comparing the phase of a digital input data signal with that of a clock signal delivered by a reference oscillator, said device including:

a first channel formed by a bistable flip-flop receiving said digital data signal on one input and said clock signal on a clock input and delivering a comparison signal, a first exclusive OR logic gate receiving said digital data signal on a first input and said comparison signal on a second input, said first channel delivering a first detection signal of transition of the digital signal, a second channel formed by a second exclusive OR logic gate receiving the digital data signal on a first input, a delay circuit whose delay value is set and equal to half the period of said clock signal, said delay circuit receiving said digital data signal and delivering a delayed digital data signal to a second input of said second exclusive OR gate, said second channel delivering a second detection signal of transition of the digital input signal.

2. The device of claim 1, wherein said reference oscillator is an oscillator with stabilized central frequency.

3. The device of claim 1, wherein said reference oscillator is a controlled oscillator, said device furthermore comprising a loop filtering circuit, said loop filtering circuit receiving the signal delivered by the first and the second channel and delivering a control signal, delivered to the input of said controlled oscillator, thereby enabling a phase locked loop to be formed.

4. The device of claim 3, wherein said delay circuit is an adjustable delay circuit formed by a number N of inverter circuits connected in cascade, each inverter affording an elementary switching delay being controlled by said control signal.

5. The device of claim 3, wherein said reference oscillator is a ring oscillator formed by an odd number of inverters, each inverter being controlled by said control signal.

6. The device of claim 5, wherein said delay circuit is formed by inverters and the number of inverters forming said delay circuit and said ring oscillator is identical, said inverters being paired.

* * * * *